(12) United States Patent
Kim

(10) Patent No.: US 8,289,234 B2
(45) Date of Patent: *Oct. 16, 2012

(54) ORGANIC LIGHT EMITTING DISPLAY (OLED)

(75) Inventor: Yang-Wan Kim, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 983 days.

This patent is subject to a terminal disclaimer.

(21) Appl. No.: 11/488,114

(22) Filed: Jul. 18, 2006

(65) Prior Publication Data

US 2007/0040770 A1   Feb. 22, 2007

(30) Foreign Application Priority Data

Aug. 16, 2005   (KR) .................. 10-2005-0074865

(51) Int. Cl.
G09G 3/30 (2006.01)

(52) U.S. Cl. ............. 345/76; 345/78; 345/204; 313/463

(58) Field of Classification Search .............. 345/76, 345/204

See application file for complete search history.

(56) References Cited

U.S. PATENT DOCUMENTS

| | | | |
|---|---|---|---|
| 5,021,774 A | | 6/1991 | Ohwada |
| 5,402,141 A | * | 3/1995 | Haim et al. ............. 345/88 |
| 6,046,890 A | | 4/2000 | Yamada et al. |
| 6,229,506 B1 | | 5/2001 | Dawson et al. |
| 6,847,172 B2 | | 1/2005 | Suzuki |
| 6,864,637 B2 | | 3/2005 | Park et al. |
| 6,885,029 B2 | * | 4/2005 | Miyazawa .................. 257/59 |
| 6,919,871 B2 | | 7/2005 | Kwon |
| 7,301,744 B2 | * | 11/2007 | Miyazawa ................. 361/100 |
| 8,049,684 B2 | * | 11/2011 | Kim ........................ 345/76 |
| 2001/0019327 A1 | | 9/2001 | Kim et al. |
| 2002/0196389 A1 | | 12/2002 | Koyama |
| 2003/0043132 A1 | | 3/2003 | Nakamura |
| 2003/0085885 A1 | | 5/2003 | Nakayoshi |

(Continued)

FOREIGN PATENT DOCUMENTS

CN    1312535    9/2001

(Continued)

OTHER PUBLICATIONS

Office action from Chinese Patent Office issued in Applicant's corresponding Chinese Patent Application No. 200610108798.7 dated Feb. 6, 2009.

(Continued)

*Primary Examiner* — Grant Sitta
(74) *Attorney, Agent, or Firm* — Robert E. Bushnell, Esq.

(57) ABSTRACT

An Organic Light Emitting Display (OLED) that is capable of decreasing the number of output lines for a data driver using a demultiplexer, displaying an image with uniform brightness, and adjusting white balance includes: a plurality of red, green and blue sub-pixels, and each sub-pixel is provided with an auxiliary capacitor to compensate a decreased driving voltage. The respective auxiliary capacitors are different in capacitance according to emission efficiency of the red, green and blue sub-pixels. The auxiliary capacitor of the green sub-pixel has a larger capacitance than the auxiliary capacitor of the red sub-pixel, and the auxiliary capacitor of the red sub-pixel has a larger capacitance than the auxiliary capacitor of the blue sub-pixel. This enables the white balance to be adjusted with the same data voltage.

9 Claims, 7 Drawing Sheets

U.S. PATENT DOCUMENTS

| | | | |
|---|---|---|---|
| 2003/0098657 A1 | 5/2003 | Suzuki | |
| 2003/0179164 A1 | 9/2003 | Shin et al. | |
| 2003/0227262 A1* | 12/2003 | Kwon | 315/169.3 |
| 2004/0080474 A1 | 4/2004 | Kimura | |
| 2004/0090400 A1 | 5/2004 | Yoo | |
| 2004/0104870 A1 | 6/2004 | Mametsuka | |
| 2004/0145547 A1* | 7/2004 | Oh | 345/76 |
| 2004/0207583 A1* | 10/2004 | Koo et al. | 345/82 |
| 2004/0239599 A1 | 12/2004 | Koyama | |
| 2005/0024297 A1 | 2/2005 | Shin | |
| 2005/0068271 A1 | 3/2005 | Lo | |
| 2005/0093464 A1* | 5/2005 | Shin et al. | 315/169.1 |
| 2005/0156829 A1 | 7/2005 | Choi et al. | |
| 2007/0118781 A1* | 5/2007 | Kim | 714/727 |

FOREIGN PATENT DOCUMENTS

| | | |
|---|---|---|
| CN | 1428757 | 7/2003 |
| CN | 1490779 | 4/2004 |
| CN | 1499473 | 5/2004 |
| CN | 1577453 | 2/2005 |
| EP | 1 496 495 | 12/2005 |
| EP | 1 635 324 | 3/2006 |
| JP | 10254412 | 9/1998 |
| JP | 2001147659 | 5/2001 |
| JP | 2002328643 | 11/2002 |
| JP | 2003-140612 | 5/2003 |
| JP | 2003-150082 | 5/2003 |
| JP | 2003140612 | 5/2003 |
| JP | 2004-012634 | 1/2004 |
| JP | 2004-012897 | 1/2004 |
| JP | 2004029791 | 1/2004 |
| JP | 2004-093682 | 3/2004 |
| JP | 2004-117921 | 4/2004 |
| JP | 2004-334179 | 11/2004 |
| JP | 2005-031630 | 2/2005 |
| JP | 2005134874 | 5/2005 |
| KR | 10-2002-0090574 | 12/2002 |
| KR | 1020030095215 | 12/2003 |
| KR | 1020050041088 | 5/2005 |
| WO | 01/06484 | 1/2001 |
| WO | 03105117 | 12/2003 |

OTHER PUBLICATIONS

Office action from USPTO issued in Applicant's related U.S. Appl. No. 11/521,849 dated Sep. 22, 2009.

Office action from Japanese Patent Office issued in Applicant's corresponding Japanese Patent Application No. 2006-218301 dated Dec. 8, 2009 and Request for Entry of the Accompanying Office Action for the Japanese Office action attached herewith.

Issue Notification from Chinese Patent Office issued in Applicant's corresponding Chinese Patent Application No. 200610108798.7 dated Feb. 24, 2010, and Request for Entry of the Accompanying Document for the Chinese Issue Notification attached herewith.

S.M Choi, et al. "A Self-compensated Voltage Programming Pixel Structure for Active-Matrix Organic Light Emitting Diodes", in Japanese Office action issued on Aug. 16, 2011 by Japanese Patent Office, corresponding to Japanese Patent Application No. 2006-218301.

Office Action from the Chinese Patent Office issued in Applicant's corresponding Chinese Patent Application No. 200610108798.7 dated Mar. 28, 2008.

Search Report from the European Patent Office issued in Applicant's corresponding European Patent Application No. 06254299.8 dated Jun. 4, 2008.

Choi et al., *"A Self-Compensated Voltage Programming Pixel Structure for Active-Matrix Organic Light Emitting Diodes"* XP008057381, pp. 535-538, 2003.

\* cited by examiner

ORGANIC LIGHT EMITTING DISPLAY (OLED)

CLAIM OF PRIORITY

This application makes reference to, incorporates the same herein, and claims all benefits accruing under 35 U.S.C. §119 from an application for ORGANIC ELECTROLUMINESCENT DISPLAY DEVICE earlier filed in the Korean Intellectual Property Office on the 16 of Aug. 2005 and there duly assigned Serial No. 10-2005-0074865.

BACKGROUND OF THE INVENTION

1. Field of the Invention

The present invention relates to an Organic Light Emitting Display (OLED), and more particularly, to an OLED that is capable of decreasing the number of output lines for a data driver using a demultiplexer, displaying an image with uniform brightness, and adjusting white balance.

2. Description of the Related Art

Recently, various flat panel displays have been developed as alternatives to a relatively heavy and bulky cathode ray tube. Flat Panel Displays (FPDs) include Liquid Crystal Displays (LCDs), Field Emission Displays (FEDs), Plasma Display Panels (PDPs), Organic Light Emitting Displays (OLEDs), etc.

Among the FPDs, the OLED includes an organic light emitting diode that emits light for itself by recombination of electrons from a cathode and holes from an anode. Such an OLED has advantages in that its response time is relatively fast (about 1 μs) and its power consumption is relatively low. Generally, the OLED employs a Thin Film Transistor (TFT) provided in each pixel for supplying a driving current corresponding to a data signal to the organic light emitting diode, thereby allowing the organic light emitting diode to emit light and display a predetermined image.

An OLED includes a display panel, a scan driver, a data driver, and a timing controller.

The display panel includes a plurality of pixels formed in regions where a plurality of scan lines, a plurality of emission control lines, and a plurality of data lines intersect each other. The respective pixels receive a first power supply and a second power supply from the outside, and emit light corresponding to data signals transmitted from the plurality of data lines, thereby displaying a predetermined image. Furthermore, in the pixels, their emission times are controlled by emission control signals transmitted through the emission control lines.

The scan driver generates scan signals in response to a scan control signal from the timing controller, and sequentially supplies the scan signals to the plurality of scan lines, thereby selecting the pixels. Furthermore, the scan driver generates emission control signals in response to the scan control signal, and sequentially supplies the emission control signals to the plurality of emission control lines, thereby controlling the light emission.

The data driver receives red (R), green (G) and blue (B) data from the timing controller, generates the data signals in response to a data control signal, and supplies the data signals to the plurality of data lines The data driver supplies the data signal corresponding to one horizontal line to the data lines per one horizontal period.

The timing controller generates the data control signal and the scan control signal in correspondence to video data and horizontal/vertical synchronous signals supplied from an external graphic controller. The timing controller respectively supplies the data control signals and the scan control signals to the data driver and the scan drive.

In an OLED with this configuration, the respective pixels are placed in regions where the plurality of scan lines, the plurality of emission control lines, and the plurality of data lines intersected each other. The data driver is provided with m output lines to respectively supply the data signals to m data lines. That is, in this OLED, the data driver must be provided with the same number of output lines as the number of data lines. Accordingly, the data driver internally includes a plurality of data Integrated Circuits (IC) to have m output lines, thereby increasing manufacturing cost. In particular, as the resolution and size of the display panel increases, the data driver needs more data ICs, thereby further increasing the manufacturing cost.

SUMMARY OF THE INVENTION

The present invention, therefore, provides an Organic Light Emitting Display (OLED) that is capable of decreasing the number of output lines for a data driver using a demultiplexer, displaying an image with uniform brightness, and adjusting white balance with uniform voltage.

In an exemplary embodiment of the present invention, an Organic Light Emitting Display (OLED) having a plurality of pixels each having a red sub-pixel, a green sub-pixel, and a blue sub-pixel is provided, each sub-pixel including: a pixel driver connected to a data line, a scan line and a first power supply voltage line, and including a storage capacitor adapted to store a driving voltage supplied via the data line, and to generate a predetermined driving current; and an organic light emitting diode connected between the pixel driver and a second power supply voltage line, and adapted to emit light with a brightness corresponding to the driving current; and an auxiliary capacitor connected between the storage capacitor and the scan line, and adapted to generate a compensation voltage to increase the driving voltage; the auxiliary capacitors of the sub-pixels have different capacitances according to an emission efficiency ratio of their respective sub-pixels.

The capacitance of the auxiliary capacitor is inversely proportional to a driving current ratio of the sub-pixels to generate a white pixel. The auxiliary capacitor of the green sub-pixel has a larger capacitance than that of the auxiliary capacitor of the red sub-pixel, and the auxiliary capacitor of the red sub-pixel has a larger capacitance than that of the auxiliary capacitor of the blue sub-pixel.

A compensation voltage increased by the auxiliary capacitor is defined by the following equation:

$$Vx = Caux/(Cst+Caux)*(VVDD-VVSS)$$

where Vx is the compensation voltage, Caux is the capacitance of the auxiliary capacitor, Cst is the capacitance of the storage capacitor, VVDD is a high level scan signal, and VVSS is a low level scan signal.

The pixel driver further includes: an initialization transistor connected between a first terminal of the storage capacitor and an initialization voltage line, and adapted to be turned-on by an $(n-1)^{th}$ scan signal to initialize the storage capacitor; a first switching transistor connected to the data line, and adapted to be turned-on by an $n^{th}$ scan signal to transmit the data voltage; a driving transistor having a first electrode connected to the first switching transistor and a gate electrode connected to a first terminal of the storage capacitor, and adapted to generate the driving current; a threshold voltage compensation transistor connected between the gate electrode and a second electrode of the driving transistor, and adapted to be turned-on by the $n^{th}$ scan signal to cause the driving transistor be diode-connected and to compensate a threshold voltage of the driving transistor; and a second switching transistor connected between the first power supply voltage line and the second electrode of the driving transistor, and adapted to be turned-on by an $n^{th}$ emission control signal to transmit the first power supply voltage to the second electrode of the driving transistor.

The pixel driver further includes an emission control transistor connected between the driving transistor and the organic light emitting diode, and adapted to be turned-on by the $n^{th}$ emission control signal to transmit the driving current to the organic light emitting diode.

The first through sixth transistors include N or P MOSFETs having the same conductivity type.

In another exemplary embodiment of the present invention, an Organic Light Emitting Display (OLED) is provided including: a display panel having a plurality of pixels adapted to display an image; a scan driver adapted to supply a scan signal to the display panel; a data driver adapted to supply a data signal to the display panel; a timing controller adapted to generate a data control signal to control the data signal and a scan control signal to control the scan driver; a demultiplexer coupled between the data driver and the display panel, and adapted to sequentially supply the data signal to corresponding sub-pixels that constitute the pixel; and a demultiplexer controller adapted to control the demultiplexer.

The demultiplexer is connected to the display panel via data lines connected to respective sub-pixels. The data lines are respectively connected to auxiliary capacitors and wherein the auxiliary capacitors have different capacitances according to their respective sub-pixels.

The auxiliary capacitors have different capacitances corresponding to an emission efficiency of their respective sub-pixels. The auxiliary capacitors of the green, red, and blue sub-pixels have respective capacitances in order of green>red>blue.

The demultiplexer sequentially supplies the data signals to each sub-pixel during a horizontal period.

The scan driver supplies the scan signal to the pixel, such that the data signals are simultaneously provided to the sub-pixels.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
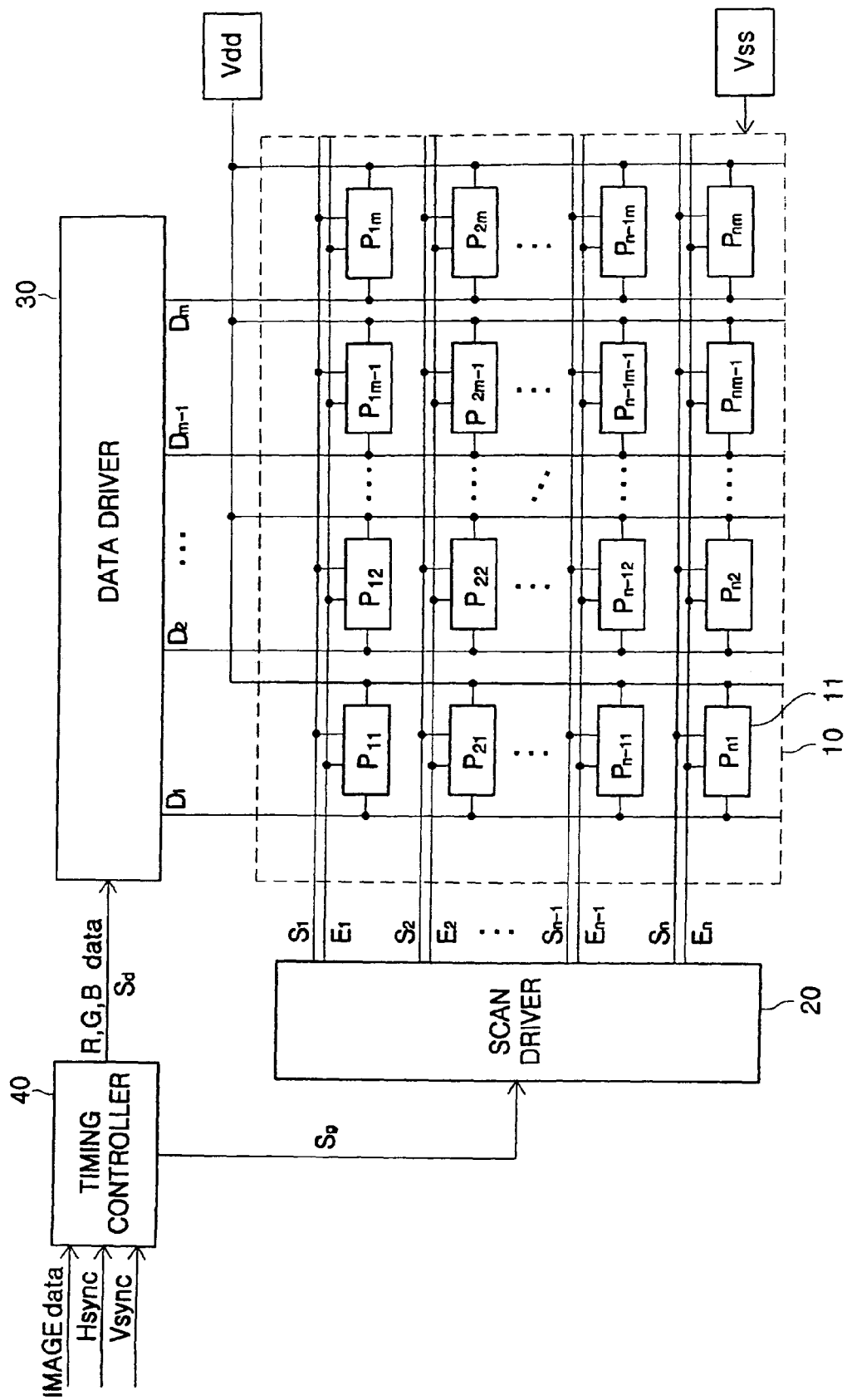
FIG. 1 is a block diagram of an OLED.

FIG. 1 is a block diagram of an OLED. Referring to FIG. 1, the OLED includes a display panel 10, a scan driver 20, a data driver 30, and a timing controller 40.

The display panel 10 includes a plurality of pixels P11 through Pnm formed in regions where a plurality of scan lines S1 through Sn, a plurality of emission control lines E1 through En, and a plurality of data lines D1 through Dm intersect each other. The respective pixels P11 through Pnm receive a first power supply Vdd and a second power supply Vss from the outside, and emit light corresponding to data signals transmitted from the plurality of data lines D1 through Dm, thereby displaying a predetermined image. Furthermore, in the pixels P11 through Pnm, their emission times are controlled by emission control signals transmitted through the emission control lines E1 through En.

The scan driver 20 generates scan signals in response to a scan control signal Sg from the timing controller 40, and sequentially supplies the scan signals to the plurality of scan lines S1 through Sn, thereby selecting the pixels P11 through Pnm. Furthermore, the scan driver 20 generates emission control signals in response to the scan control signal Sg, and sequentially supplies the emission control signals to the plurality of emission control lines E1 through En, thereby controlling the light emission.

The data driver 30 receives red (R), green (G) and blue (B) data from the timing controller 40, generates the data signals in response to a data control signal Sd, and supplies the data signals to the plurality of data lines D1 through Dm. The data driver 30 supplies the data signal corresponding to one horizontal line to the data lines D1 through Dm per one horizontal period.

The timing controller 40 generates the data control signal Sd and the scan control signal Sg in correspondence with video data and horizontal/vertical synchronous signals Hsync and Vsync supplied from an external graphic controller (not shown). The timing controller 40 respectively supplies the data control signals Sd and the scan control signals Sg to the data driver 30 and the scan driver 20.

In an OLED with this configuration, the respective pixels P11 through Pnm are placed in regions where the plurality of scan lines S1 through Sn, the plurality of emission control lines En through Em, and the plurality of data lines D1 through Dm intersect each other. The data driver 30 is provided with m output lines to respectively supply the data signals to m data lines D1 through Dm. That is, in this OLED, the data driver 30 must be provided with the same number of output lines as the number of data lines D1 through Dm. Accordingly, the data driver 30 internally includes a plurality of data integrated circuits (IC) to have m output lines, thereby increasing manufacturing cost. In particular, as the resolution and size of the display panel 10 increases, the data driver 30 needs more data ICs, thereby further increasing the manufacturing cost.

Hereinafter, exemplary embodiments of the present invention are described with reference to accompanying drawings.

Figure 2:
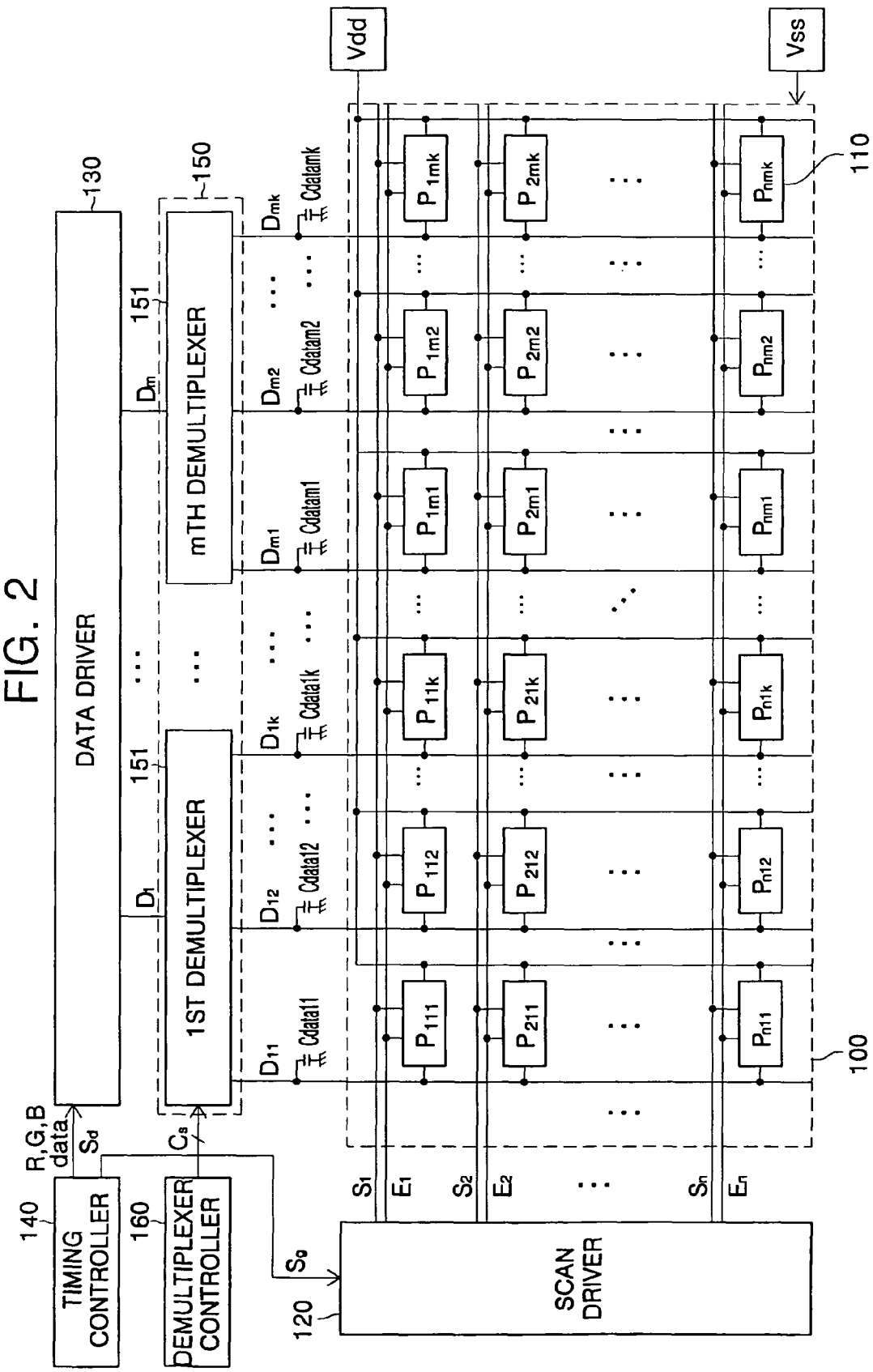
FIG. 2 is a block diagram of an OLED according to an embodiment of the present invention.

FIG. 2 is a block diagram of an OLED according to an embodiment of the present invention. Referring to FIG. 2, an OLED according to an embodiment of the present invention includes a display panel 100, a scan driver 120, a data driver 130, a timing controller 140, a demultiplexer unit 150, and a demultiplexer controller 160.

The display panel 100 includes a plurality of pixels P111 through Pnmk which are placed in regions defined by a plurality of scan lines S1 through Sn, a plurality of emission control lines E1 through En, and a plurality of data lines D11 through Dmk.

The respective pixels P111 through Pnmk emit light corresponding to data signals supplied through the corresponding data lines D11 through Dmk. Among the pixels P111 through Pnmk, a representative pixel 110 will be described later.

Furthermore, the data lines D11 through Dmk corresponding to the pixels P111 through Pnmk are respectively provided with a plurality of data line capacitors $C_{data11}$ through $C_{datamk}$ to temporarily store the data signals.

For example, during a data program period, when a data voltage is supplied to the $1^{st}$ data line D11 to cause the $1^{st}$ pixel P111 emit light, the $1^{st}$ data line capacitor $C_{data11}$ formed in the data line D11 stores the data voltage temporarily. Next, during a scan period, when the $1^{st}$ pixel P111 is selected by the $1^{st}$ scan signal S1, the data voltage stored in the $1^{st}$ data line capacitor $C_{data11}$ is supplied to the $1^{st}$ pixel P111, thereby causing the $1^{st}$ pixel P111 emit the light corresponding to the data voltage.

Thus, the data line capacitors $C_{data11}$, through $C_{datamk}$ formed in the data lines D11 through Dmk respectively temporarily store the data signals to be supplied to the plurality of data lines D11 through Dmk. Furthermore, the data line capacitors $C_{data11}$ through $C_{datamk}$ supply the stored data voltage to the pixels P111 through Pnmk selected by the scan signals. The data line capacitors $C_{data11}$ through $C_{datamk}$ are achieved by parasitic capacitors equivalently formed by the data lines D11 through Dmk, a third electrode, and an insulating layer interposed therebetween. Substantially, each of the data line capacitors $C_{data11}$ through $C_{datamk}$ equivalently formed in the data lines D11 through Dmk preferably has a capacitance larger than the capacitance of a storage capacitor Cst provided in each of the pixel P111 through Pnmk in order to stably store the data signal.

Figure 6:
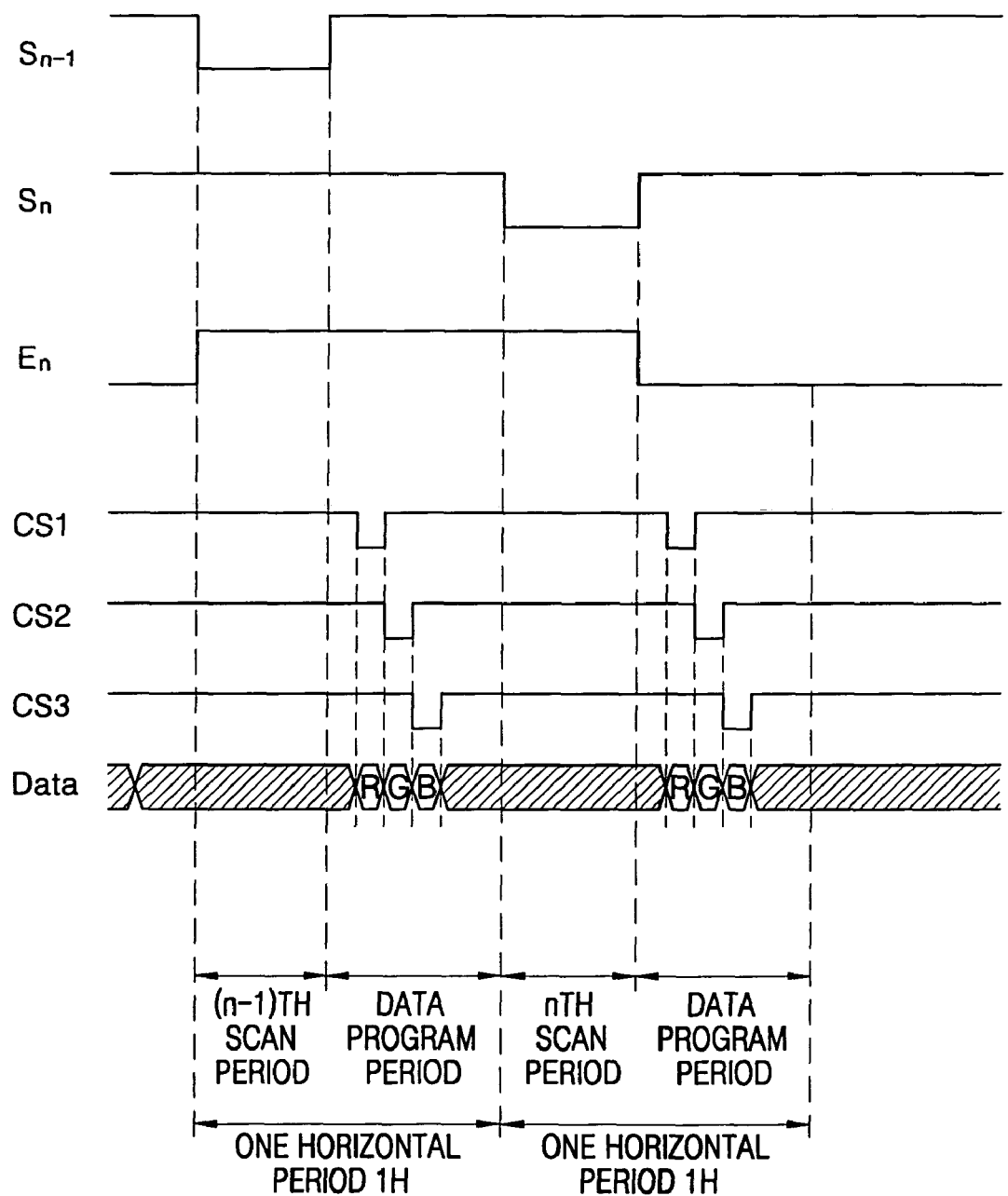
FIG. 6 is a timing diagram of the pixel circuit of FIG. 5.

The scan driver 120 generates the scan signals in response to scan control signals Sg supplied from the timing controller 140, and sequentially supply the scan signals to the scan lines S1 through Sn. The scan driver 110 supplies the scan signal only in a predetermined period (i.e., the scan period) of one horizontal period 1H as shown in FIG. 6. According to an embodiment of the present invention, one horizontal period 1H is divided into the scan period and the data program period. The scan driver 120 supplies the scan signal to the scan line Sn in the scan period of one horizontal period, and does not supply the scan signal in the data program period. Furthermore, the scan signal can be supplied during the data program period. So, the scan period can be overlapped with the data program period. The scan driver 120 generates the emission control signals in response to the scan control signals Sg, and sequentially supplies the emission control signals to the emission control lines E1 through En.

The data driver 130 receives R, G and B data from the timing controller 140, and sequentially supplies R, G and B data signals to output lines D1 through Dm in response to data control signals Sd. The data driver 130 sequentially supplies k data signals (where k is an integer larger than 2, e.g., k is three R, G and B data signals as shown in FIG. 6) to the output lines D1 through Dm connected to respective output terminals. In more detail, the data driver 130 sequentially supplies the data signals (e.g., the R, G and B data) to the corresponding pixels in the data program period of one horizontal period 1H. The data signals (R, G and B) to be supplied to the corresponding pixels are supplied only during the data program period.

The timing controller 140 generates the data control signals Sd and the scan control signals Sg in correspondence with video data and horizontal and vertical synchronous signals supplied from an external graphic controller (not shown). The timing controller 140 respectively supplies the data control signals Sd and the scan control signals Sg to the data driver 130 and the scan driver 120.

The demultiplexer unit 150 includes m demultiplexers 151. Specifically, the demultiplexer unit 150 includes the same number of demultiplexers 151 as the number of output lines D1 through Dm connected to the data driver 130, and input terminals of the demultiplexers 151 are connected to the output terminals D1 through Dm of the data driver 130, respectively. Furthermore, an output terminal of the demultiplexer 151, e.g., the $1^{st}$ demultiplexer is connected to k data lines D11 through D1k. The $1^{st}$ demultiplexer 151 applies k data signals, which are sequentially supplied in the data program period, to k data lines D11 through D1k. When the k data signals sequentially supplied to one output line D1 are sequentially supplied to the k data lines D11 through D1k, the number of output lines provided in the data driver 130 can be remarkably decreased. For example, when k=3, the number of output lines provided in the data driver 130 is divided by 3, and thus the number of data ICs provided in the data driver 130 is also reduced. According to an embodiment of the present invention, the demultiplexer 151 is used for supplying the data signal corresponding to one output line D1 to k data lines D11 through D1k, thereby reducing the manufacturing cost of the data IC.

The demultiplexer controller 160 supplies k control signals to control terminals of the demultiplexer 151 in the data program period of one horizontal period 1H such that k data signals are divided and supplied through the output line D1 to k data lines D11 through D1k. The k control signals supplied from the demultiplexer controller 160 are sequentially supplied as shown in FIG. 6, without overlapping each other in the data program period. In this embodiment, the demultiplexer controller 160 is externally provided in the timing controller 140. Alternatively, the demultiplexer controller 160 can be internally provided in the timing controller 140.

Figure 3:
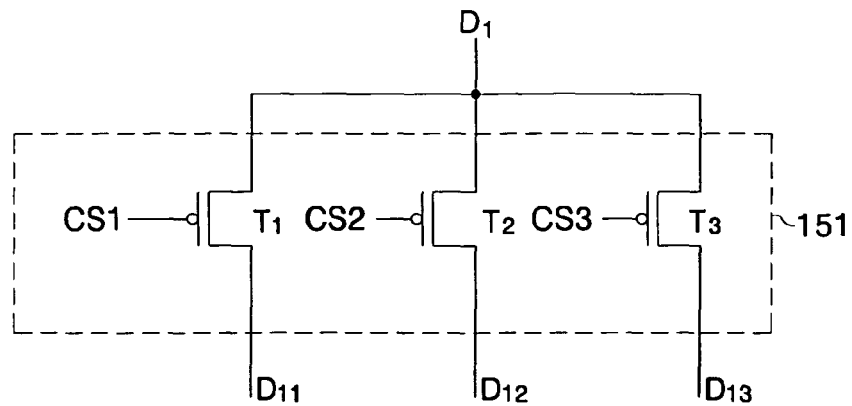
FIG. 3 is an internal circuit diagram of a demultiplexer of FIG. 2.

FIG. 3 is an internal circuit diagram of the demultiplexer of FIG. 2. In FIG. 3, for convenience of explanation, the demultiplexer is described on the assumption that k is 3 and data is input in the order of red, green and blue. Furthermore, the demultiplexer is described on the assumption that it is connected to the $1^{st}$ output line D1 of the data driver 130.

Referring to FIG. 3, the demultiplexer 151 includes a first switching element T1, a second switching element T2, and a third switching element T3. Each of the switching elements T1, T2 and T3 can be made of a Thin Film Transistor (TFT). In this embodiment, the switching elements T1, T2 and T3 are formed of P-channel Metal Oxide Semiconductor Field Effect Transistors (PMOSFETs), but are not limited thereto. Alternatively, the switching elements T1, T2 and T3 can be formed of n-channel MOSFETs.

The first switching element T1 is connected between the $1^{st}$ output line D1 and the $1^{st}$ data line D11. The first switching element T1 is turned-on when a first control signal CS1 is supplied from the demultiplexer controller 160, and supplies a red data signal from the $1^{st}$ output line D1 to the $1^{st}$ data line D11. The data signal supplied to the $1^{st}$ data line D11 is stored in the $1^{st}$ data line capacitor $C_{data11}$ in the data program period of FIG. 2.

The second switching element T2 is connected between the 1st output line D1 and the 2nd data line D12. The second switching element T2 is turned-on when a second control signal CS2 is supplied from the demultiplexer controller 160, and supplies a green data signal from the 1st output line D1 to the 2nd data line D12. The data signal supplied to the 2nd data line D12 is stored in the 2nd data line capacitor $C_{data12}$ in the data program period of FIG. 2.

The third switching element T3 is connected between the 1st output line D1 and the 3rd data line D13. The third switching element T3 is turned-on when a third control signal CS3 is supplied from the demultiplexer controller 160, and supplies a blue data signal from the 1st output line D1 to the 3rd data line D13. The data signal supplied to the 3rd data line D13 is stored in the 3rd data line capacitor $C_{data13}$ in the data program period of FIG. 2.

Detailed operations of the demultiplexer 151 are described later in association with the structure of the pixel 110.

Figure 4:
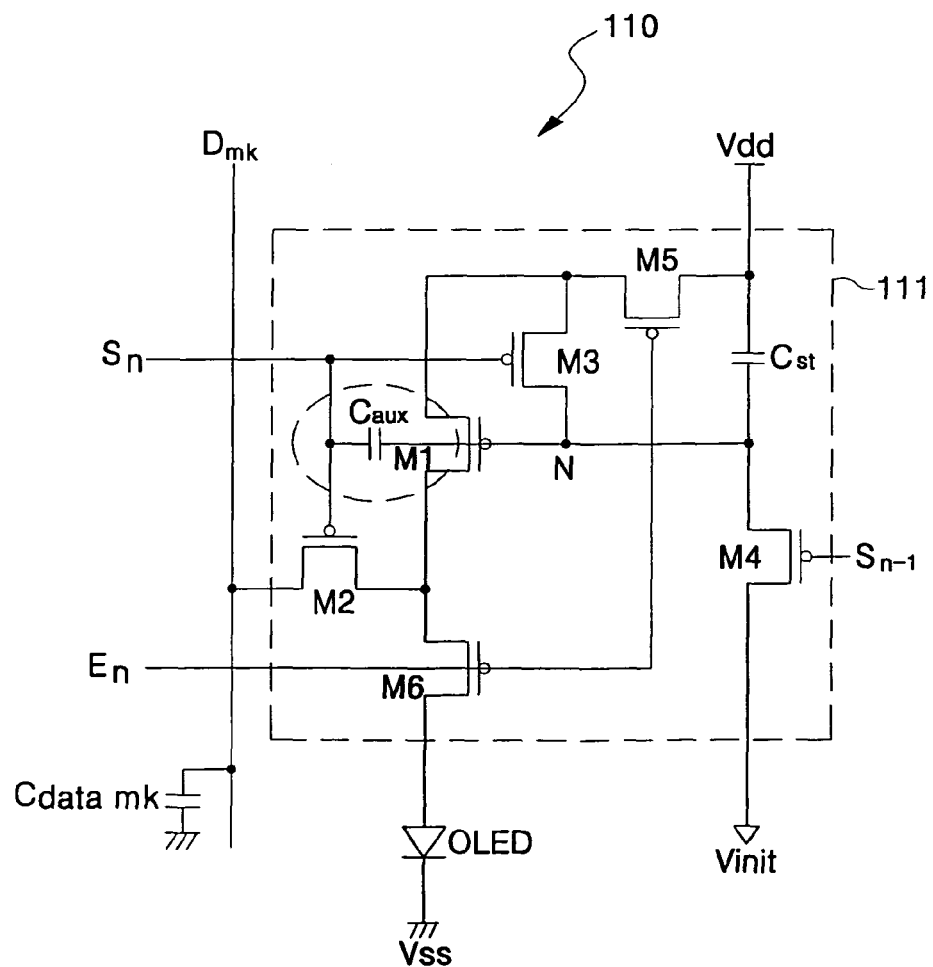
FIG. 4 is a circuit diagram of a representative pixel among N×M pixels of FIG. 2.

FIG. 4 is a circuit diagram of a representative pixel among N×M pixels of FIG. 2. The pixels according to an embodiment of the present invention are not limited to the pixel shown in FIG. 4.

Referring to FIG. 4, the pixel 110 according to an embodiment of the present invention includes an organic light emitting diode; and a pixel driving circuit 111 connected to a data line Dmk, previous and current scan lines Sn–1 and Sn, an emission control line En, a first power supply voltage line Vdd, and an initialization voltage line Vinit and generating driving current to cause the organic light emitting diode to emit light. Furthermore, the data line capacitor $C_{datamk}$ is formed in the data line Dmk to supply the data voltage to the pixel 110.

The organic light emitting diode has an anode electrode connected to the pixel driving circuit 111, and a cathode electrode connected to a second power supply voltage line Vss. A second power supply Vss has a lower voltage than a first power supply Vdd, e.g., a ground voltage, a negative voltage or the like. Thus, the organic light emitting diode emits light corresponding to the driving current supplied from the pixel driving circuit 111.

The pixel driving circuit 111 includes one storage capacitor Cst and six transistors M1 through M6. The first transistor M1 acts as a driving transistor, the third transistor M3 acts as a threshold voltage compensation transistor for compensating a threshold voltage by causing the first transistor M1 be diode-connected, and the fourth transistor M4 acts as an initialization transistor for initializing the storage capacitor Cst. Furthermore, the sixth transistor M6 acts as an emission control transistor for controlling the emission of the organic light emitting diode, and the second and fifth transistors M2 and M5 act as switching transistors.

The first switching transistor M2 has a gate electrode connected to the current scan line Sn and a source electrode connected to the data line Dmk, and is turned-on by the scan signal transmitted through the current scan line Sn, thereby transmitting the data voltage supplied from the data line capacitor $C_{datamk}$.

The driving transistor M1 has a source electrode connected to a drain electrode of the first switching transistor M2, and a gate electrode connected to a node N. At the node N, a source or drain electrode of the threshold voltage compensation transistor M3 and a first terminal of the storage capacitor Cst are connected in common, and a gate voltage of the driving transistor M1 is determined. Thus, the driving transistor M1 generates a driving current corresponding to the voltage supplied to the gate electrode.

The threshold voltage compensation transistor M3 is connected between the gate and source electrodes of the driving transistor M1, and causes the driving transistor M1 be diode-connected in response to the scan signal transmitted through the current scan line Sn. Thus, the driving transistor M1 acts as a diode according to the scan signal, thereby supplying a voltage of Vdata-Vth [V] to the node N. The voltage of Vdata-Vth [V] is used as the gate voltage of the driving transistor M1.

The initialization transistor M4 is connected between the initialization voltage line Vinit and the first terminal of the storage capacitor Cst, and discharges electrical charges stored in the storage capacitor Cst during the previous frame through the initialization voltage line Vinit in response to the scan signal of the $(n-1)^{th}$ scan line Sn–1 connected to the gate electrode, thereby initializing the storage capacitor Cst.

The second switching transistor M5 is connected between the first power supply voltage line Vdd and the source electrode of the driving transistor M1, and is turned-on by the emission control signal transmitted through the emission control line En connected to the gate electrode thereof, thereby supplying the first power voltage Vdd to the source electrode of the driving transistor M1.

The emission control transistor M6 is connected between the driving transistor M1 and the organic light emitting diode, and transmits the driving current to the organic light emitting diode, wherein the driving current is generated in the driving transistor M1 in response to the emission control signal transmitted through the emission control line En connected to the gate electrode thereof.

The storage capacitor Cst is connected between the first power supply voltage line Vdd and the gate electrode of the driving transistor M1, and maintains electrical charges corresponding to the voltage of Vdata-Vth[V] supplied between the first power voltage Vdd and the gate electrode of the driving transistor M1 for one frame.

In FIG. 4, the first through sixth transistors M1 through M6 are formed of PMOSFETs, but are not limited thereto. Alternatively, the first through sixth transistors M1 through M6 can be formed of NMOSFETs.

Thus, a voltage corresponding to the data signal is stored in the data line capacitor $C_{datamk}$ in the data program period, and the voltage stored in the data line capacitor $C_{datamk}$ is supplied to the pixel in the scan period, thereby supplying the data signal to the pixel with the foregoing configuration. Because the voltages stored in the data line capacitors $C_{data11}$ through $C_{data1k}$ are supplied to the pixels at the same time, respectively, i.e., because the data signals are supplied at the same time, an image is displayed with uniform brightness.

However, as the data program period and the scan period are separated using the demultiplexer, the data line capacitor $C_{datamk}$ and the storage capacitor Cst of the pixel, which are separated from each other in the data program period, are connected to each other in the scan period, so that the electrical charge corresponding to the data voltage Vdata stored in the data line capacitor $C_{datamk}$ is shared between the data line capacitor $C_{datamk}$ and the storage capacitor Cst. Hence, the gate voltage $Vg_{M1}$, of the driving transistor M1 can be substantially obtained by Equation 1.

$$Vg_{M1}=(Cdata*Vdata+Cst*Vinit)/(Cdata+Cst) \quad \text{Equation 1:}$$

where, $Vg_{M1}$, is a gate voltage of the driving transistor M1, Vdata is a data voltage, Vinit is an initialization voltage, Vdd is a first power supply voltage, Cdata is the capacitance of each data line capacitor, and Cst is the capacitance of each storage capacitor of the pixel.

Referring to Equation 1, the difference between the gate voltage $Vg_{M1}$, of the driving transistor M1 and the data voltage Vdata varies depending on the capacitance of the data line capacitor Cdata and the storage capacitor Cst. That is, a voltage lower than the data voltage supplied to the data line is supplied to the gate electrode of the driving transistor. Thus, it is difficult to display black, so that a contrast ratio is lowered.

This problem can be solved by increasing a black data voltage. However, it is impossible to supply the higher black data voltage because of the specifications of the data driver. Alternatively, this problem can be solved by lowering the first power supply voltage Vdd. In this case, black can be displayed, but the second power supply voltage Vss must be lowered as much as the first power supply voltage Vdd. Therefore, DC/DC efficiency of the second power supply voltage Vss is remarkably decreased.

Therefore, the pixel according to an embodiment of the present invention includes an auxiliary capacitor Caux therein as shown in FIG. 4.

The auxiliary capacitor Caux has a first electrode connected in common to the current scan line Sn and the gate electrode of the first switching transistor M2, and a second electrode connected in common to the storage capacitor Cst and the gate electrode of the driving transistor M1.

The auxiliary capacitor Caux boosts up the gate voltage $V_G$ of the driving transistor M1 while making a transition from the scan period to the emission period. It is assumed that a low level voltage of the scan signal is a low scan voltage VVSS, and a high level voltage of the scan signal is a high scan voltage VVDD. The voltage supplied to the first electrode of the auxiliary capacitor Caux is transitioned from the low scan voltage VVSS to the high scan voltage VVDD, so that the gate voltage of the driving transistor M1 is boosted up as much as a compensation voltage due to coupling between the storage capacitor Cst and the auxiliary capacitor Caux.

Finally, the gate voltage $V_G$ of the driving transistor M1 can be obtained by Equation 2.

$$Cst(V_G - Vg_{M1}) = Caux\{(Vg_{M1} - V_G) - (VVSS - VVDD)\}$$

$$V_G = Vg_{M1} + Caux/(Cst + Caux)*(VVDD - VVSS) \quad \text{Equation 2:}$$

where, $V_G$ is a gate voltage of the driving transistor M1 after forming the auxiliary capacitor Caux, $Vg_{M1}$, is a gate voltage of the driving transistor M1 before forming the auxiliary capacitor Caux, VVDD is the high level scan signal, VVSS is the low level scan signal, Caux is the capacitance of the auxiliary capacitor, and Cst is the capacitance of the storage capacitor.

Referring to Equation 2, after forming the auxiliary capacitor Caux, the gate voltage of the driving transistor M1 increases as much as the compensation voltage of Caux/(Cst+Caux)*(VVDD−VVSS), thereby compensating the decreased voltage.

For example, when the first power supply voltage Vdd is equal to the black data voltage, a very high black level current of about 7 nA flows in the driving transistor M1 before forming the auxiliary capacitor Caux, so that a contrast ratio is greatly lowered. On the other hand, according to an embodiment of the present invention, a black level current of about 0.02 nA flows in the driving transistor M1 after forming the auxiliary capacitor Caux, thereby satisfying the specifications of the data driver, and enhancing the contrast ratio. Preferably, the capacitance of the storage capacitor Cst is larger than that of the auxiliary capacitor Caux. In the foregoing example, the measured currents are obtained under the condition that the capacitance of the storage capacitor Cst is larger than that of the auxiliary capacitor Caux by ten times.

Figure 5:
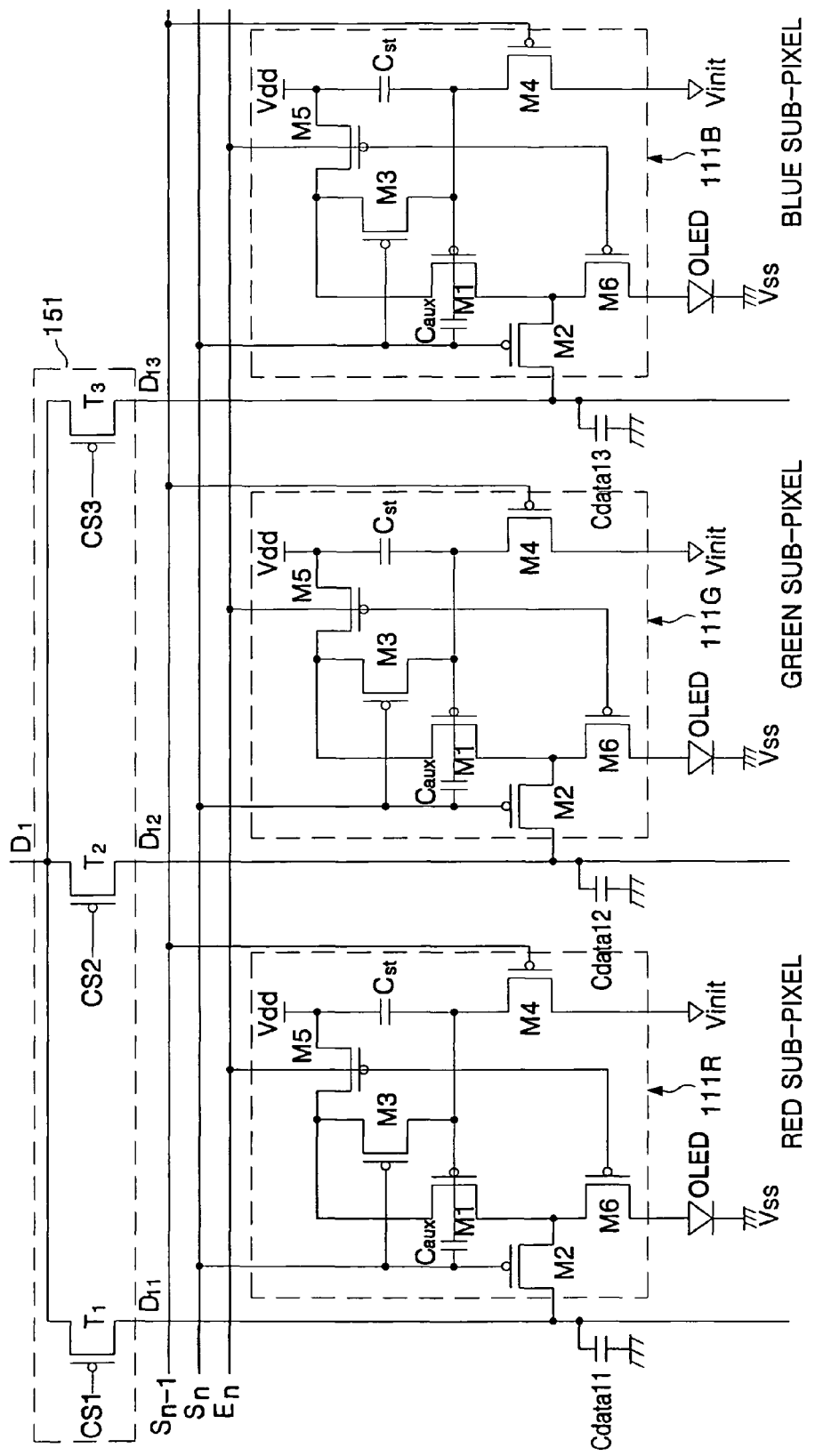
FIG. 5 is a circuit diagram of a detailed connection structure between the representative demultiplexer of FIG. 3 and the representative pixels of FIG. 4 according to an embodiment of the present invention.

FIG. 5 is a circuit diagram of the detailed connection structure between the representative demultiplexer of FIG. 3 and the representative pixels of FIG. 4 according to an embodiment of the present invention, and FIG. 6 is a timing diagram illustrating operations of the pixel circuit of FIG. 5.

In FIG. 5, assuming that red (R), green (G) and blue (B) sub-pixels are connected to one demultiplexer 151 connected to the $1^{st}$ output line D1 (i.e., k=3).

Referring to FIGS. 5 and 6, a low level scan signal is supplied to the $(n-1)^{th}$ scan line Sn−1 in the $(n-1)^{th}$ scan period of one horizontal period 1H. When the low level scan signal is supplied to the $(n-1)^{th}$ scan line Sn−1, each initialization transistor M4 of the R, G and B sub-pixels is turned-on. As the initialization transistor M4 is turned-on, a first terminal of the storage capacitor Cst and the gate electrode of the driving transistor M1 are connected to the initialization voltage line Vinit. That is, when the low level scan signal is supplied to the $(n-1)^{th}$ scan line Sn−1, a previous frame data voltage stored in each storage capacitor Cst of the R, G and B sub-pixels, i.e., the gate voltage of the driving transistor M1 is initialized. Thus, when the low level scan signal is supplied to the $(n-1)^{th}$ scan line Sn−1, the first switching transistor M2 connected to the $n^{th}$ scan line Sn maintains a turned-off state.

Then, a first switching element T1, a second switching element T2, and a third switching element T3 are turned-on in sequence by first through third control signals CS1, CS2 and CS3 sequentially supplied in the data program period. First, when the first switching element T1 is turned-on by the first control signal CS1, the R data signal is supplied from the first output line D1 to the first data line D11. The first data line capacitor $C_{data11}$ then stores a voltage corresponding to the R data signal supplied to the first data line D11. Next, when the second switching element T2 is turned-on by the second control signal CS2, the G data signal is supplied from the first output line D1 to the second data line D12. The second data line capacitor $C_{data12}$ then stores a voltage corresponding to the G data signal supplied to the second data line D12. Finally, when the third switching element T3 is turned-on by the third control signal CS3, the B data signal is supplied from the first output line D1 to the third data line D13. The third data line capacitor $C_{data13}$ then stores a voltage corresponding to the B data signal supplied to the third data line D13. The scan signal is not supplied to the $n^{th}$ scan line Sn during the data program period, so that the R, G and B data signals are not supplied to the R, G and B pixels.

Then, in the $n^{th}$ scan period following the data program period, a low level scan signal is supplied to the $n^{th}$ scan line Sn. When the scan signal is supplied to the $n^{th}$ scan line Sn, each first switching transistor M2 and each threshold voltage compensation transistor M3 of the R, G and B pixels are turned-on. Each first switching transistor M2 of the R, G and B pixels respectively transmits the voltages Vdata corresponding to the R, G and B data signals, which are stored in the first through third data line capacitors $C_{data11}$ through $C_{data13}$ during the data program period, to the R, G and B pixels. The threshold voltage compensation transistor M3 allows the driving transistor M1 to be diode-connected. Through the diode-connected driving transistor M1, a voltage (Vdata−$Vth_{M1}$[V]) corresponding to the difference between the threshold voltage Vth of the driving transistor M1 and the voltage Vdata corresponding to the R, G and B data signals, which are stored in the first through third data line capacitors $C_{data11}$ through $C_{data13}$, is supplied to the gate electrode of the driving transistor M1 and the first terminal of the storage capacitor Cst. The voltage supplied to the gate terminal of the driving transistor M1 is based on Equation 1.

Then, when the $n^{th}$ scan signal is changed to a high level and a low level emission control signal is supplied to the emission control line En, the second switching transistor M5 and the emission control transistor M6 are turned-on, so that the first power supply voltage Vdd supplied to the source electrode of the driving transistor M1 and a driving current corresponding to the gate voltage are supplied to the organic light emitting diode through the emission control transistor M6, thereby emitting light with predetermined brightness. The gate voltage of the driving transistor M1 is based on Equation 2.

Thus, in the OLED according to an embodiment of the present invention, the R, G and B data signals sequentially supplied from one $1^{st}$ output line D1 can be supplied to k data lines D11 through D1k using the demultiplexer 151. Furthermore, voltages corresponding to the data signals are stored in the data line capacitors $C_{data11}$ through $C_{data1k}$ in the data program period, and the voltages stored in the data line capacitors $C_{data11}$ through $C_{data1k}$ are supplied to the pixels during the scan period. Thus, the voltages stored in the data line capacitors $C_{data11}$ through $C_{data1k}$ are supplied to the pixels at the same time, so that the data signals are supplied at the same time, thereby displaying an image with uniform brightness.

Furthermore, the auxiliary capacitor Caux is provided in each pixel, so that the lowering of the voltage supplied to the pixel due to charge sharing between the data line capacitor Cdata and the storage capacitor Cst is avoided, thereby enhancing the contrast ratio.

In the OLED according to an embodiment of the present invention, red, green and blue organic materials are used to emit light. The red, green and blue organic materials are different in emission brightness according to the intensity of a current flowing therein. That is, the red, green and blue organic materials are different in efficiency, so that the red, green and blue data voltage must be different so as to adjust white balance. However, when differences among the red, green and blue data voltages are large, it is difficult to drive the OLED.

Therefore, in the OLED according to an embodiment of the present invention, the red, green and blue sub-pixels have auxiliary capacitors which have different respective capacitances, thereby adjusting the white balance with the same data voltage.

Figure 7:
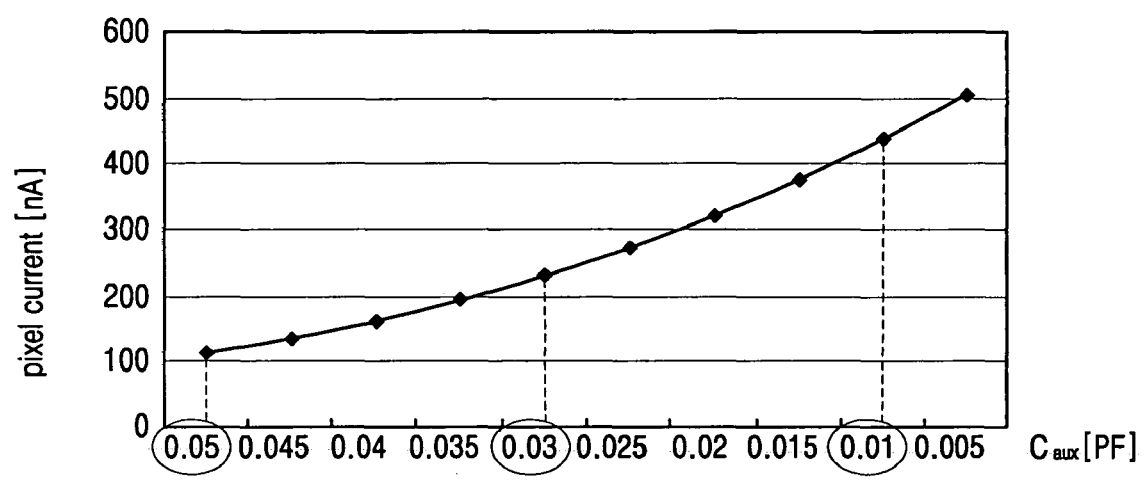
FIG. 7 is a simulation graph of changes in a driving current according to the capacitance of an auxiliary capacitor in a pixel of FIG. 4.

FIG. 7 is a simulation graph showing changes in a driving current according to the capacitance of the auxiliary capacitor in the pixel of FIG. 4.

In FIG. 7, the horizontal axis indicates the capacitance of the auxiliary capacitor Caux, and the capacitance decreases as goes to the right. The unit of capacitance of the auxiliary capacitor Caux is PF (Picofarads). The vertical axis indicates a white current flowing in the pixel, and the unit of the white current is nA (Nanoamperes).

As shown in FIG. 7, the current in the pixel increases as the capacitance of the auxiliary capacitor Caux decreases with respect to the same data voltage. For example, when the auxiliary capacitor Caux has a capacitance of 0.05 PF, the pixel has a current of 10 nA. When the auxiliary capacitor Caux has a capacitance of 0.03 PF, the pixel has a current of 220 nA. When the auxiliary capacitor Caux has a capacitance of 0.01 PF, the pixel has a current of 440 nA. Generally, the emission efficiency of the organic material increases in order of green>red>blue.

Thus, when the red, green and blue sub-pixels have a white current ratio of about 2:1:4 to generate a white pixel, the auxiliary capacitors Caux of the red, green and blue sub-pixels have a capacitance ratio of about 3:5:1, thereby adjusting the white balance with the same data voltage. That is, the capacitance of each auxiliary capacitor is inversely proportional to the white current ratio.

Figure 8:
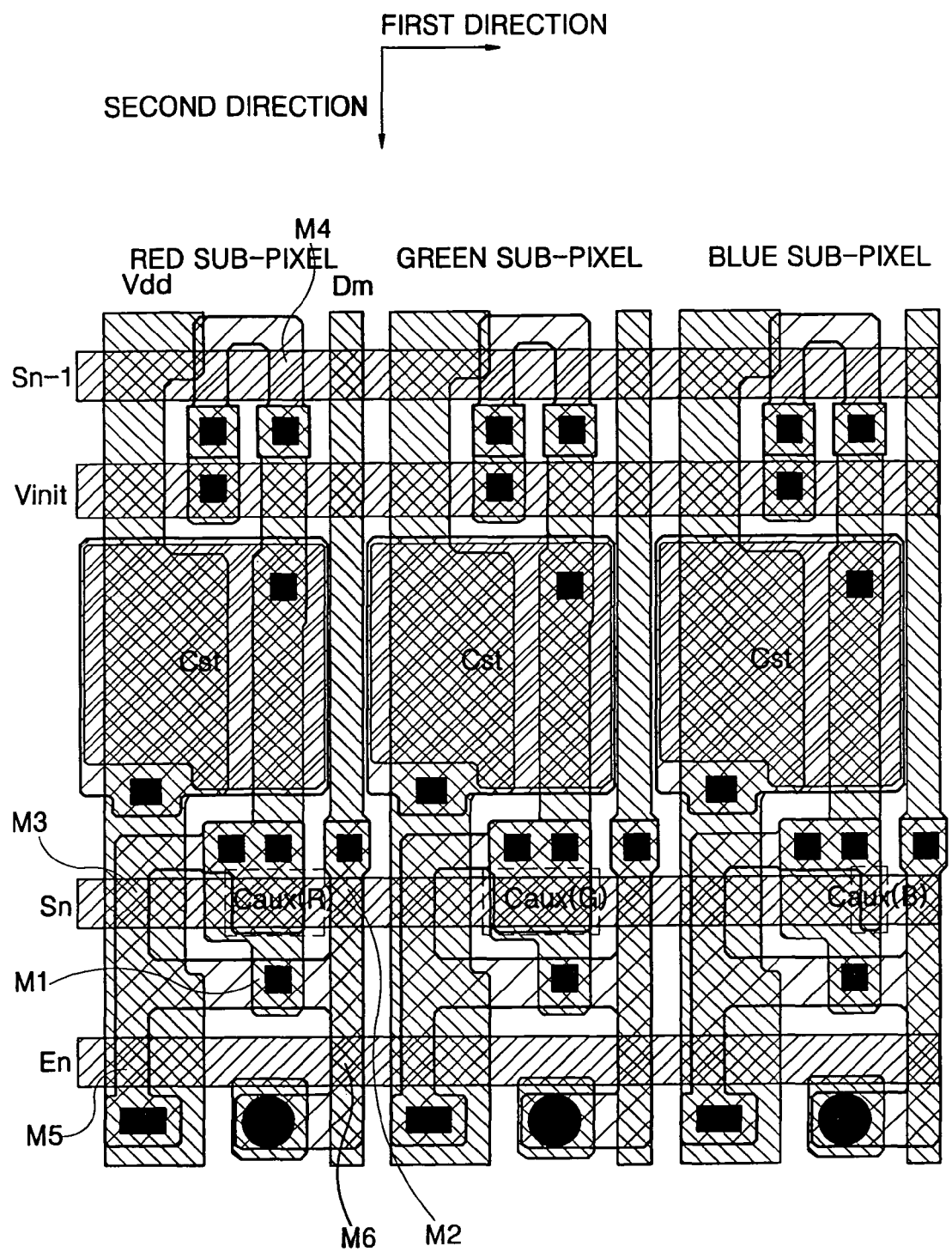
FIG. 8 is a layout diagram of red, green and blue sub-pixels capable of adjusting white balance with the same voltage based on the simulation of FIG. 7 according to an embodiment of the present invention.

FIG. 8 is a layout diagram of red, green and blue sub-pixels capable of adjusting white balance with the same voltage based on the simulation of FIG. 7 according to an embodiment of the present invention.

Referring to FIG. 8, the red, green and blue pixels have the same layout except the capacitance of the auxiliary capacitor. Furthermore, each pixel circuit has the connection structure as shown in FIG. 4, and the layout of FIG. 8 is as follows.

In the R pixel, the previous scan line Sn−1, the current scan line Sn, the emission control line En and the initialization voltage line Vinit extend parallel to one another in a first direction. Furthermore, the first power supply voltage line Vdd and the data line Dm extend parallel to each other in a second direction. The lines extending along the first direction and the lines extending along the second direction intersect each other, with an insulating layer interposed therebetween.

As shown in FIG. 8, the first switching transistor M2, the driving transistor M1, the threshold voltage compensation transistor M3, the second switching transistor M5, and the emission control transistor M6 are formed of a first semiconductor layer. Furthermore, the initialization transistor M4 is formed of a second semiconductor layer.

The current scan line Sn functions as gate electrodes of the first switching transistor M2 and the threshold voltage compensation transistor M3. The previous scan line Sn−1 functions as a gate electrode of the initialization transistor M4. Furthermore, the emission control line En functions as gate electrodes of the second switching transistor M5 and the emission control transistor M6.

The storage capacitor Cst includes an upper substrate and a lower substrate corresponding to the first power supply voltage line. The auxiliary capacitor Caux includes a lower substrate corresponding to the current scan line Sn and an upper substrate corresponding to the gate electrode of the driving transistor M2. The auxiliary capacitor Caux varies in size according to the red, green and blue pixels. The capacitance of the auxiliary capacitor Caux can be adjusted by changing the size of the upper substrate used as the gate electrode of the driving transistor M2.

As shown in FIG. 7, when the red, green and blue sub-pixels have a white current ratio of 2:1:4, then the auxiliary capacitors Caux should have a capacitance ratio of 3:5:1, so that the white balance can be adjusted with respect to the same data voltage. Therefore, as shown in FIG. 8, the auxiliary capacitors Caux(R), Caux(G) and Caux(B) of the red, green and blue sub-pixels are different in size.

The capacitance of the auxiliary capacitor Caux varies according to the emission efficiency of each organic material. As the emission efficiency of each organic material increases, i.e., the brightness increases with respect to the same intensity of current, the capacitance of the auxiliary capacitor Caux should become larger. Generally, the green organic material has the highest emission efficiency, the red organic material has the second emission efficiency, and the blue organic material has the lowest emission efficiency. Therefore, the capacitance of the auxiliary capacitor Caux is determined in order of green>red>blue.

As described above, in the OLED according to an embodiment of the present invention, each pixel includes the auxiliary capacitor Caux, so that the decreased data voltage supplied to the pixel by driving the demultiplexer is compensated, and thus the contrast ratio is enhanced by allowing black to be displayed. Thus, there is no need to lower the power supply voltage Vdd and Vss, and the DC/DC efficiency is not decreased.

Furthermore, the capacitance of the auxiliary capacitor Caux varies according to each emission efficiency of the red, green and blue sub-pixels, so that the white balance is adjusted with the same data voltage, and thus the OLED is easily driven.

Although the present invention has been described with reference to certain exemplary embodiments thereof, it will be understood by those skilled in the art that a variety of modifications and variations can be made to the present invention without departing from the spirit or scope of the present invention defined in the appended claims.

What is claimed is:

1. An Organic Light Emitting Display (OLED) having a plurality of pixels each having a red sub-pixel, a green sub-pixel, and a blue sub-pixel, each sub-pixel comprising:
a pixel driver connected to a data line, a scan line and a first power supply voltage line, and including a storage capacitor adapted to store a driving voltage supplied via the data line, and generating a predetermined driving current; and
an organic light emitting diode connected between the pixel driver and a second power supply voltage line, and adapted to emit light with a brightness corresponding to the driving current; and
an auxiliary capacitor directly connected between the storage capacitor and the scan line, and adapted to generate a compensation voltage to increase the driving voltage according to a scan voltage transition of a scan signal transmitted through the scan line;
wherein the auxiliary capacitors of the sub-pixels have different capacitances according to an emission efficiency ratio of their respective sub-pixels, and the auxiliary capacitor comprises a first electrode directly connected to the scan line and a second electrode directly connected to a gate electrode of a driving transistor which solely generates the driving current, and
wherein the compensation voltage is increased by the auxiliary capacitor solely as defined by:

$$Vx = Caux/(Cst+Caux)*(VVDD-VVSS)$$

where Vx is the compensation voltage, Caux is a capacitance of the auxiliary capacitor, Cst is a capacitance of the storage capacitor, VVDD is a high level scan signal, and VVSS is a low level scan signal, and
wherein the auxiliary capacitor of the green sub-pixel has a larger capacitance than that of the auxiliary capacitor of the red sub-pixel, the auxiliary capacitor of the red sub-pixel has a larger capacitance than that of the auxiliar capacitor of the blue sub ixel and the ca$_p$acitance of the auxiliary capacitor Caux is determined in order of green>red>blue.

2. The OLED according to claim 1, wherein the capacitance of the auxiliary capacitor is inversely proportion to a driving current ratio of the sub-pixels to generate a white pixel.

3. The OLED according to claim 1, wherein the pixel driver further comprises:
an initialization transistor connected between a first terminal of the storage capacitor and an initialization voltage line, and adapted to be turned-on by an $(n-1)^{th}$ scan signal to initialize the storage capacitor;
a first switching transistor connected to the data line, and adapted to be turned-on by an $n^{th}$ scan signal to transmit the data voltage;
a driving transistor having a first electrode connected to the first switching transistor and a gate electrode connected to a first terminal of the storage capacitor, and adapted to generate the driving current;
a threshold voltage compensation transistor connected between the gate electrode and a second electrode of the driving transistor, and adapted to be turned-on by the $n^{th}$ scan signal to cause the driving transistor be diode-connected and to compensate a threshold voltage of the driving transistor; and
a second switching transistor connected between the first power supply voltage line and the second electrode of the driving transistor, and adapted to be turned-on by an $n^{th}$ emission control signal to transmit the first power supply voltage to the second electrode of the driving transistor.

4. The OLED according to claim 3, wherein the pixel driver further comprises an emission control transistor connected between the driving transistor and the organic light emitting diode, and adapted to be turned-on by the $n^{th}$ emission control signal to transmit the driving current to the organic light emitting diode.

5. The OLED according to claim 4, wherein the driving transistor, the first switching transistor, the threshold voltage compensation transistor, the initialization transistor, the second switching transistor, and the emission control transistor comprise N or P MOSFETs having the same conductivity type.

6. An Organic Light Emitting Display (OLED), comprising:
a plurality of pixels each having a red sub-pixel, a green sub-pixel, and a blue sub-pixel, each sub-pixel comprising:
a pixel driver connected to a data line, a scan line and a first power supply voltage line, and including a storage capacitor adapted to store a driving voltage supplied via the data line, and generating a predetermined driving current; and
an organic light emitting diode connected between the pixel driver and a second power supply voltage line, and adapted to emit light with a brightness corresponding to the driving current; and
an auxiliary capacitor directly connected between the storage capacitor and the scan line, and adapted to generate a compensation voltage to increase the drivin voltage according to a scan voltage transition of a scan signal transmitted through the scan line, the auxiliary capacitors of the sub-pixels having different capacitances according to an emission efficiency ratio of the sub-pixels corresponding to the auxiliary capacitor, and the auxiliary capacitor comprises a first electrode directly connected to the scan line and a second electrode directly connected to a gate electrode of a driving transistor which solely generates the driving current, and
wherein the compensation voltage is increased by the auxiliary capacitor solely as defined by:

$$Vx = Caux/(Cst+Caux)*(VVDD-VVSS)$$

where Vx is the compensation voltage, Caux is a capacitance of the auxiliary capacitor, Cst is a capacitance of the storage capacitor, VVDD is a high level scan signal, and VVSS is a low level scan signal, and
wherein the auxiliary capacitor of the green sub-pixel has a larger capacitance than that of the auxiliary capacitor of the red sub-pixel, the auxiliary capacitor of the red sub-pixel has a larger capacitance than that of the auxiliary capacitor of the blue sub-pixel and the capacitance of the auxiliary capacitor Caux is determined in order of green>red>blue.

7. The OLED according to claim 6, wherein the capacitance of the auxiliary capacitor is inversely proportion to a driving current ratio of the sub-pixels to generate a white pixel.

8. The OLED according to claim 6, wherein the pixel driver further comprises:
- an initialization transistor connected between a first terminal of the storage capacitor and an initialization voltage line, and adapted to be turned-on by an (n−1)scan signal to initialize the storage capacitor;
- a first switching transistor connected to the data line, and adapted to be turned-on by an $n^{th}$ scan signal to transmit the data voltage;
- a driving transistor having a first electrode connected to the first switching transistor and a gate electrode connected to a first terminal of the storage capacitor, and adapted to generate the driving current;
- a threshold voltage compensation transistor connected between the gate electrode and a second electrode of the driving transistor, and adapted to be turned-on by the $n^{th}$ scan signal to cause the driving transistor be diode-connected and to compensate a threshold voltage of the driving transistor; and
- a second switching transistor connected between the first power supply voltage line and the second electrode of the driving transistor, and adapted to be turned-on by an $n^{th}$ emission control signal to transmit the first power supply voltage to the second electrode of the driving transistor.

9. The OLED according to claim 8, wherein the pixel driver further comprises an emission control transistor connected between the driving transistor and the organic light emitting diode, and adapted to be turned-on by the $n^{th}$ emission control signal to transmit the driving current to the organic light emitting diode.

* * * * *